(12) United States Patent
Mitani et al.

(10) Patent No.: US 10,964,785 B2
(45) Date of Patent: Mar. 30, 2021

(54) SiC EPITAXIAL WAFER AND MANUFACTURING METHOD OF THE SAME

(71) Applicant: Mitsubishi Electric Corporation, Tokyo (JP)

(72) Inventors: Yoichiro Mitani, Tokyo (JP); Yasuhiro Kimura, Tokyo (JP); Akihito Ono, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/494,771

(22) PCT Filed: Jan. 18, 2018

(86) PCT No.: PCT/JP2018/001401
§ 371 (c)(1),
(2) Date: Sep. 17, 2019

(87) PCT Pub. No.: WO2018/211737
PCT Pub. Date: Nov. 22, 2018

(65) Prior Publication Data
US 2020/0066847 A1 Feb. 27, 2020

(30) Foreign Application Priority Data
May 17, 2017 (JP) .............................. JP2017-098259

(51) Int. Cl.
*H01L 31/0312* (2006.01)
*H01L 29/16* (2006.01)
(Continued)

(52) U.S. Cl.
CPC .... *H01L 29/1608* (2013.01); *H01L 21/02378* (2013.01); *H01L 21/02447* (2013.01); *H01L 29/2003* (2013.01); *H01L 29/66053* (2013.01)

(58) Field of Classification Search
CPC ............. H01L 29/1608; H01L 29/2003; H01L 29/66053; H01L 29/02529; H01L 29/02378; H01L 21/02447
See application file for complete search history.

(56) References Cited

U.S. PATENT DOCUMENTS 10,050,109 B2 * 8/2018 Horii .................... H01L 21/0262
2014/0264384 A1 * 9/2014 Loboda ................... C30B 29/36
257/77

(Continued)

FOREIGN PATENT DOCUMENTS

JP 2005-109408 A 4/2005
JP 5353800 B2 11/2013

OTHER PUBLICATIONS

International Search Report and Written Opinion dated Feb. 27, 2018 for PCT/JP2018/001401 filed on Jan. 18, 2018, 8 pages including English Translation of the International Search Report.

(Continued)

*Primary Examiner* — Alonzo Chambliss
(74) *Attorney, Agent, or Firm* — Xsensus LLP

(57) ABSTRACT

The object of the present invention is to enhance the device yield of SiC epitaxial wafers. The SiC epitaxial wafer includes a drift layer which is a SiC epitaxial layer. The drift layer has a film thickness of 18 μm or more and 350 μm or less and has arithmetic average roughness of 0.60 nm or more and 3.00 nm or less, and the impurity concentration thereof is $1\times10^{14}/cm^3$ or more and $5\times10^{15}/cm^3$ or less.

14 Claims, 3 Drawing Sheets

(51) Int. Cl.
*H01L 29/20* (2006.01)
*H01L 29/66* (2006.01)
*H01L 21/02* (2006.01)

(56) References Cited

U.S. PATENT DOCUMENTS

| | | | |
|---|---|---|---|
| 2015/0221729 A1* | 8/2015 | Okita | H01L 29/34 |
| | | | 257/77 |
| 2015/0233018 A1* | 8/2015 | Genba | C30B 25/08 |
| | | | 428/64.1 |
| 2016/0181375 A1* | 6/2016 | Horii | H01L 21/0262 |
| | | | 257/77 |
| 2017/0073837 A1* | 3/2017 | Honke | H01L 21/02658 |

OTHER PUBLICATIONS

J. Sameshima et al., "Relation between defects on 4H-SiC epitaxial surface and gate oxide reliability", Silicon Carbide and Related Materials 2012, Trans Tech Publications, Switzerland, 2013, vols. 740-742, pp. 745-748.

\* cited by examiner

F I G. 6
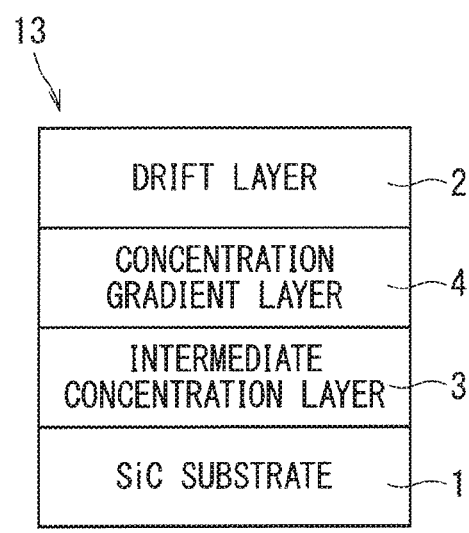
F I G. 7
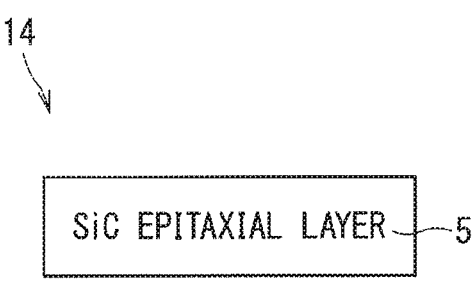

SIC EPITAXIAL WAFER AND MANUFACTURING METHOD OF THE SAME

CROSS-REFERENCE TO RELATED APPLICATIONS

The present application is based on PCT filing PCT/JP2018/001401, filed Jan. 18, 2018, which claims priority to JP 2017-098259, filed May 17, 2017, the entire contents of each are incorporated herein by reference.

TECHNICAL FIELD

The present invention relates to a technology for increasing the device yield of SiC epitaxial wafers.

BACKGROUND ART

Silicon carbide (SiC) has a larger band gap than silicon (Si), and is excellent in physical properties such as dielectric breakdown electric field strength, saturated electron velocity and thermal conductivity, and has excellent properties as a material for semiconductor power device. In particular, with the power device using the SiC, downsizing and a significant reduction of power loss is achievable, and energy saving at the time of power source power conversion can be realized. Accordingly the power device using the SiC (hereinafter, referred to as "SiC power device") contributes to improvement in electric cars and enhancement in solar cell systems, in this manner, such a SiC power device has potential as a prime device for realizing a low carbon society.

For manufacturing a SiC power device, a drift layer of a semiconductor device needs to be formed on a SiC substrate in advance. The drift layer is elaborately formed by controlling the film thickness and the carrier concentration in the crystal precisely by a chemical vapor deposition (CVD) method or the like. The drift layer is additionally formed by epitaxial growth on the substrate, because the film thickness and carrier concentration of the draft layer are substantially defined by the design specification of the device, and, further, because the carrier concentration of the drift layer is required to be controlled even more precisely than the substrate.

Hereinafter, a wafer in which an epitaxial growth layer is formed on a SiC substrate is referred to as an epitaxial wafer. A SiC power device is manufactured by subjecting the epitaxial wafer to various processes. Therefore, the proportion of devices having desired characteristics among devices fabricated from one wafer, that is, the device yield, heavily depends on the uniformity of the electrical characteristics of the epitaxial growth layer.

Accordingly, if a local region in the plane of the epitaxial wafer where the dielectric breakdown electric field is weaker than that of other regions or where a relatively large current flows when a constant voltage is applied exists, the electrical characteristics of a device including such a region is regarded as inferior. For example, poor breakdown voltage characteristics cause a leakage current even if the applied voltage is relatively small. In other words, the primary factor defining the device yield is the crystal uniformity of the epitaxial wafer. As a factor hampering the crystal uniformity of the epitaxial wafer, the existence of device-killer defects such as triangular defects or downfalls observed on the surface of the epitaxial wafer is known due to a defect at the time of epitaxial growth.

In order to improve the device yield, some methods for obtaining high quality SiC epitaxial growth layers have been proposed.

For example, a technique to form a high quality SiC epitaxial film in which, with one of pressure and substrate temperature conditions fixed, the other condition is switched between a high setting condition and a low setting condition during the film formation is described in Patent Document 1.

Further, a technique in which, in a vertical hot-wall type CVD epitaxial device, a susceptor that suppresses the occurrence of peeling or cracking of a coating material on the surface of the susceptor is used is described in Patent Document 2. This vertical hot-wall CVD epitaxial device can form a flat and high purity SiC epitaxial growth layer at high-speed.

Further, Non-Patent Document 1 describes that manufacturing a device using an epitaxial growth layer in which step bunching exits causes non-uniformity of the gate oxide film, adversely affecting the reliability thereof.

PRIOR ART DOCUMENTS

Patent Documents

[Patent Document 1] Japanese Patent No. 5353800
[Patent Document 2] Japanese Patent Application Laid-Open No. 2005-109408

Non-Patent Documents

[Non-Patent Document 1] "Relation between defects on 4H-SiC epitaxial surface and gate oxide reliability", Silicon Carbide and Related Materials 2012, Switzerland, 2013, Vols. 740-742, p. 745-748

SUMMARY

Problem to be Solved by the Invention

One of the device killer defects that lowers the device yield is a triangular defect. Generally, it is known that the main cause of generation of triangular defects is minute SiC grains adhering to a front surface of the substrate before and during formation of the epitaxial growth layer. However, there are also unique triangular defects occurring due to causes other than these. This unique triangular defect becomes noticeable by thickening the epitaxial layer when the epitaxial layer is grown under general growth conditions. Accordingly, in a device using an epitaxial layer with a film thickness of several tens of μm or more, such as a high breakdown voltage device having a breakdown voltage of 3.3 kV or more in particular, the unique triangular defect may be a definitive cause of the reduction in device yield.

The present invention has been made to solve the above-described problems, and it is an object of the present invention to increase the device yield of a SiC epitaxial wafer.

Means to Solve the Problem

According to the present invention, a SiC epitaxial wafer includes a SiC epitaxial layer. The SiC epitaxial layer has a film thickness of 18 μm or more and 350 μm or less has arithmetic average roughness of 0.60 nm or more and 3.00 nm or less, and the impurity concentration thereof is $1 \times 10^{14}$/$cm^3$ or more and $5 \times 10^{15}$/$cm^3$ or less.

A manufacturing method of a SiC epitaxial wafer according to the present invention includes placing a SiC substrate in a reaction furnace of a CVD apparatus, and forming a SiC epitaxial layer having a film thickness of 18 μm or more and 350 μm or less on the SiC substrate. The formation conditions of the SiC epitaxial layer are: a pressure in the reaction furnace is 3 kPa or more and 12 kPa or less, a C/Si ratio of material gas supplied to a reaction furnace is 1.0 or more and 1.5 or less, and a growth temperature is 1500° C. or higher and 1750° C. or lower.

Effects of the Invention

A SiC epitaxial wafer of the present invention includes a SiC epitaxial layer. The SiC epitaxial layer has a film thickness of 18 μm or more and 350 μm or less, and has arithmetic average roughness of 0.60 nm or more and 3.00 nm or less. Thus, the device yield is increased.

A manufacturing method of a SiC epitaxial wafer of the present invention includes placing a SiC substrate in a reaction furnace of a CVD apparatus, and forming a SiC epitaxial layer having a film thickness of 18 μm or more and 350 μm or less on the SiC substrate. The formation conditions of the SiC epitaxial layer are: a pressure in the reaction furnace is 3 kPa or more and 12 kPa or less, a C/Si ratio of material gas supplied to a reaction furnace is 1.0 or more and 1.5 or less, and a growth temperature is 1500° C. or higher and 1750° C. or lower. Therefore, a SiC epitaxial wafer manufactured in high device yield can be obtained.

These and other objects, features, aspects and advantages of the present invention will become more apparent from the following detailed description of the present invention when taken in conjunction with the accompanying drawings.

BRIEF DESCRIPTION OF DRAWINGS

FIG. 6 A cross-sectional view illustrating a configuration of a SiC epitaxial wafer according to Embodiment 3.

FIG. 7 A cross-sectional view illustrating a configuration of a SiC epitaxial wafer according to Embodiment 4.

DESCRIPTION OF EMBODIMENTS

Figure 1:
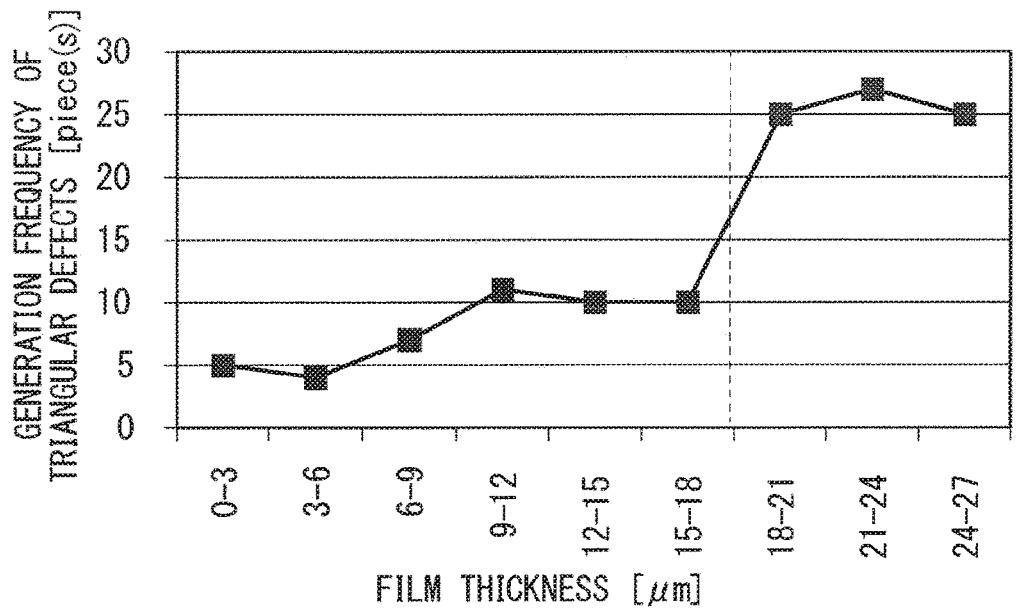
FIG. 1 A graph illustrating a relation between a film thickness of a SiC epitaxial layer and generation frequency of triangular defects.

Hereinafter, Embodiments of the present invention will be described with reference to the accompanying drawings. In the following description, similar components are illustrated with the same reference numerals, and their names and functions are the same. Therefore, detailed description about them may be omitted.

A. Embodiment 1

<A-1. Configuration>

As described above, there are device killer defects called triangular defects in the SiC epitaxial layer. It is known that the main cause of generation of triangular defects is minute SiC grains adhering to a front surface of the substrate before and during formation of the SiC epitaxial growth layer. However, there are also unique triangular defects occurring due to causes other than these. This unique triangular defect becomes noticeable by thickening the SiC epitaxial layer when the SiC epitaxial layer is grown under general growth conditions as illustrated in FIG. 1. FIG. 1 is a graph illustrating a relation between the film thickness of the SiC epitaxial layer and generation frequency of triangular defects. Here, the SiC epitaxial layer is doped with about $1 \times 10^{15}/cm^3$ of nitrogen impurity. According to FIG. 1, it can be seen that when the SiC epitaxial layer becomes the film thickness of 18 μm or more, the generation frequency of triangular defects increases remarkably.

Accordingly, in a case where the SiC epitaxial layer with a film thickness of several tens of μm or more, such as a high breakdown voltage device having a breakdown voltage of 3.3 kV or more in particular, frequent generation of the triangular defects is the definitive cause of the reduction in device yield.

The inventors conducted intensive studies on triangular defects that cause a reduction in yield in a high breakdown voltage device having a SiC epitaxial layer with a film thickness of 18 μm or more. As a result, the investors have revealed that there is a clear correlation between the surface roughness of the SiC epitaxial layer and the number of triangular defects.

Figure 2:
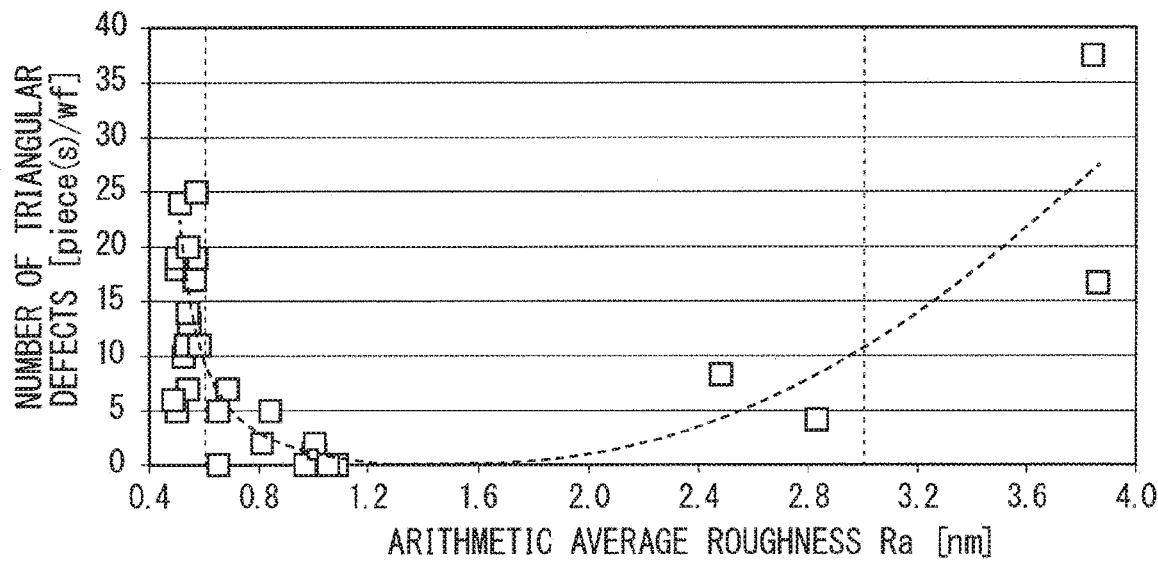
FIG. 2 A graph illustrating a correlation between the surface roughness of the SiC epitaxial layer and the number of triangular defects.

FIG. 2 is a graph illustrating the correlation between the surface roughness of the SiC epitaxial layer and the number of generation frequencies of triangular defects. The vertical axis of the graph indicates the number of triangular defects per wafer [piece(s)/wf] observed on the front surface of the SiC epitaxial layer when the SiC epitaxial layer having a film thickness of 18 μm or more is formed on a 4-inch SiC substrate. The horizontal axis of the graph indicates the average of the entire surface of the arithmetic average roughness (Ra) (hereinafter simply referred to as "the entire front surface of the SiC epitaxial layer") of the SiC epitaxial layer in the wafer.

According to FIG. 2, as the average of the entire surface of the arithmetic average roughness (Ra) of the SiC epitaxial layer increases, the number of triangular defects decreases significantly, particularly when the arithmetic average roughness (Ra) is 1.0 nm or more, the number of defects is approximately 0 pieces/wf. It is considered that this is because as the surface roughness of the epitaxial layer increases, a surface warp increases in size, the microscopic off-angle changes on the front surface, and the terrace width decreases, thereby suppressing two-dimensional nucleus growth on the front surface. Here, the terrace is an atomically smooth surface between adjacent steps on the front surface of the SiC epitaxial layer.

Further, according to FIG. 2, when the average of the entire surface of the arithmetic average roughness (Ra) of the SiC epitaxial layer increases further, the number of triangular defects increases significantly. This is because the atomic arrangement in the SiC epitaxial layer is disturbed. In order to increase the device yield in a 4-inch SiC epitaxial wafer, it is required that the number of triangular defects is 10 pieces/wf or less. Therefore, it is desirable that the average of the entire surface of the arithmetic average roughness (Ra) of the SiC epitaxial layer is 0.60 nm or more and 3.00 nm or less.

In the present specification, "the entire surface of the SiC epitaxial layer in the wafer" does not indicate the entire surface of the SiC epitaxial layer in the small piece obtained by cutting the wafer. The term indicates an area in which 5 mm from the wafer edge is excluded in the entire growth surface of the SiC epitaxial layer in the SiC epitaxial wafer having a diameter of 100 mm or more. The area of the entire surface of the SiC epitaxial layer in a wafer having a diameter of 100 mm or more is 63.5 cm² or more. The diameter of the SiC epitaxial wafer may be 150 mm or 200 mm, and in any case, "the entire surface of the SiC epitaxial layer in the wafer" indicates the area in which 5 mm from the wafer edge is excluded in the entire growth surface of the epitaxial layer in the SiC epitaxial wafer.

Figure 3:
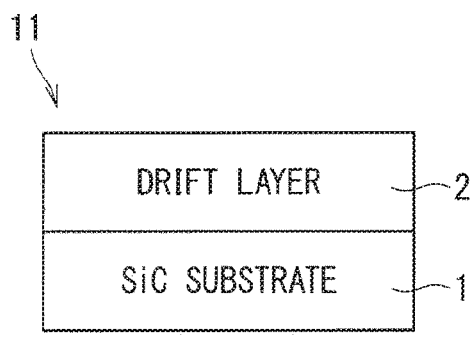
FIG. 3 A cross-sectional view illustrating a configuration of a SiC epitaxial wafer according to Embodiment 1.

FIG. 3 is a cross-sectional view illustrating a configuration of a SiC epitaxial wafer 11 according to Embodiment 1. The SiC epitaxial wafer 11 includes a SiC substrate 1 and a drift layer 2. The drift layer 2 is formed on the upper surface of the SiC substrate 1, in other words, the SiC substrate 1 is formed on the lower surface of the drift layer 2. The SiC substrate 1 is obtained, for example, by slicing an ingot grown by a sublimation method and mirror-polishing is applied thereon. The drift layer 2 is formed by epitaxial growth on the SiC substrate 1. That is, the drift layer 2 is the SiC epitaxial layer. Generally, when the film thickness of the SiC epitaxial layer is set to 18 μm or more, triangular defects caused by the above-described two-dimensional nuclear growth are generated on the surface at a frequency of 20 [pieces/M] or more, and this adversely affects on the device. Therefore, it is essential to reduce these defects.

According to FIG. 2, setting the entire surface of the arithmetic average roughness (Ra) of the SiC epitaxial layer to 0.60 nm or more and 3.00 nm or less ensures the reduction in the number of triangular defects to 10 pieces/wf or less which increases the device yield. Therefore, the average of the entire surface of the arithmetic average roughness (Ra) of the drift layer is set to 0.60 nm or more and 3.00 nm or less.

In Embodiment 1, the surface roughness of the SiC epitaxial layer is evaluated on the entire surface of the SiC epitaxial layer on the wafer. The evaluation aims at reducing triangular defects on the entire surface of the SiC epitaxial layer and improving the yield, therefore the evaluation range of the surface roughness is expanded as much as possible. On the other hand, in Patent Document 2, the evaluation range of surface roughness is a 10 μm square area.

Figure 4:
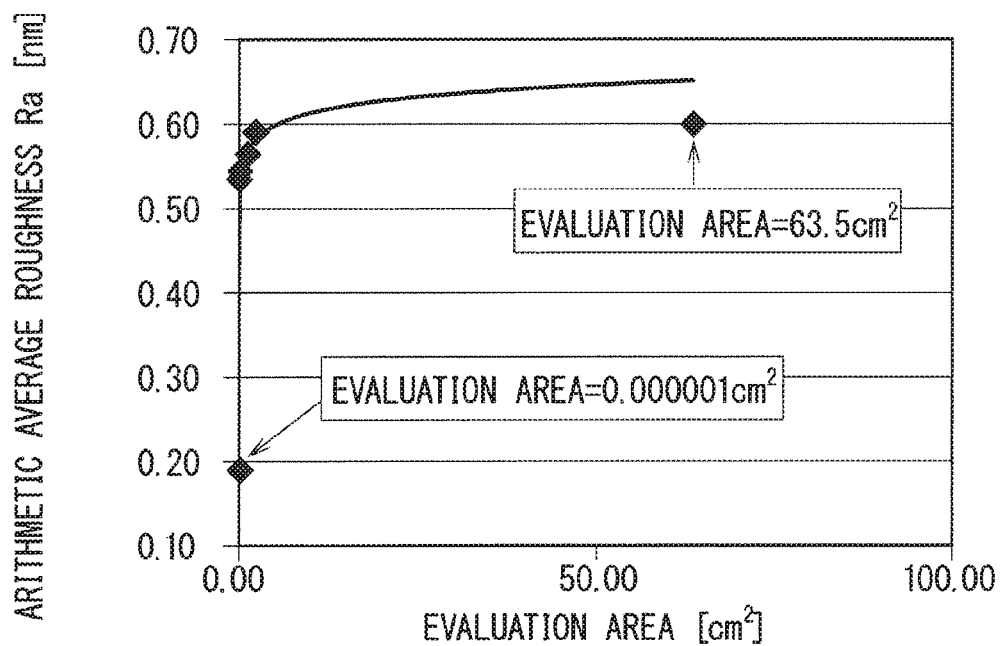
FIG. 4 A graph illustrating the evaluation area dependency of a value of the surface roughness in the same wafer.

FIG. 4 is a graph illustrating the evaluation area dependency of a value of the surface roughness in the same wafer. For example, when the evaluation range is the entire surface (about 63.5 cm²) for the SiC epitaxial wafer having a diameter of 100 mm, the arithmetic average roughness Ra is 0.60 nm. On the other hand, when the evaluation range is a 10 μm square area (0.000001 cm²), the arithmetic average roughness Ra is 0.19 nm. That is, as apparent from FIG. 4, the evaluation results of the surface roughness of the same wafer greatly differ depending on the evaluation area. Accordingly, two surface roughness values having different evaluation areas cannot be treated equally.

Furthermore, in the epitaxial layer having a surface root mean square roughness of 1.60 nm disclosed in Patent Document 2, step bunching exists; therefore, reduction in device yield is inevitable. On the other hand, in Embodiment 1, the drift layer 2 which is the SiC epitaxial layer is formed such that the total surface average of arithmetic average roughness (Ra) is 0.60 nm or more and 3.00 nm or less. Therefore, no remarkable unevenness such as step bunching is observed in the SiC epitaxial layer, and the entire surface has uniform surface roughness, which does not adversely affect on the reliability of the oxide film at the time of device fabrication.

Note that, here, it has been described that the SiC epitaxial layer is doped with about $1\times10^{15}$/cm³ of nitrogen impurity; however, the allowable concentration of nitrogen impurity for the SiC epitaxial layer is $1\times10^{14}$/cm³ or more and $5\times10^{15}$/cm³ or less.

Further, in Embodiment 1, the one with nitrogen (N) as the impurity is doped has been described, however, as the impurity, phosphorus (P), arsenic (As), antimony (Sb), aluminum (Al), boron (B), gallium (Ga), indium (In), or the like can be used.

In Embodiment 1, the evaluation range of the arithmetic average roughness (Ra) of the SiC epitaxial layer is described as the entire front surface, however, for a larger wafer, the evaluation range of the arithmetic average roughness (Ra) is not necessarily the entire surface, and an area of 63.5 cm² or more may suffice as the evaluation range.

<A-2. Manufacturing Method>

The manufacturing method of a SiC epitaxial wafer 11 will be described below.

First, a SiC substrate 1 is prepared. The SiC substrate 1 is a 4H-SiC n-type substrate doped with nitrogen as an impurity at an average concentration of $1\times10^{17}$ cm⁻³ or more and $1\times10^{20}$ cm⁻³ or less. The SiC substrate 1 has a thickness of 300 μm or more and 400 μm or less. The front surface of the SiC substrate 1 has an inclination angle of about 4 degrees in the [11-20] direction from the (0001) plane.

Next, the SiC substrate 1 is placed in a reaction furnace of a CVD apparatus, and heated to a desired heating temperature. Then, hydrogen as a carrier gas and a cleaning gas for the front surface of the SiC substrate, mono-silane and propane as material gases, and nitrogen as a dopant gas, are respectively introduced, the pressure in the reaction furnace is controlled in the range between 3 kPa and 12 kPa to start SiC epitaxial growth. At this time, the C/Si ratio of the fed material gases is set to 1.0 or more and 1.5 or less, and the growth temperature is set to 1500° C. or higher and 1700° C. or lower. The nitrogen flow rate is controlled so that the impurity concentration of the drift layer 2 is $1\times10^{14}$ cm⁻³ or more and $5\times10^{15}$ cm⁻³ or less. The film is formed at a growth rate of 9 μm/h or more, and the drift layer 2 is formed to have a thickness of 18 μm or more and 350 μm or less. Note that, the upper limit of the film thickness of the drift layer 2 is 350 μm from the viewpoint of productivity and device specification.

As a result of evaluating the SiC epitaxial wafer 11 formed under the above conditions by the Photo Luminescence (PL) topography method, the Basal Plane Dislocation (BPD) density is 1 piece/cm² or less in average on the entire surface of the wafer. By the above-described steps, a SiC epitaxial wafer is produced in which there are very few triangular defects that become noticeable when the SiC epitaxial layer is thickened, and there are no local irregularities such as step bunching.

<A-3. Effect>

The SiC epitaxial wafer 11 of Embodiment 1 includes the drift layer 2 which is a SiC epitaxial layer. The drift layer 2 has a film thickness of 18 μm or more and 350 μm or less. Generally, when the film thickness of the SiC epitaxial layer is increased to 18 μm or more, the number of triangular defects increases, but by setting the arithmetic average roughness of the drift layer 2 in the wafer to 0.60 nm or more and 3.00 nm or less, the number of triangular defects can be significantly reduced. Thus, the device yield is improved.

Further, in the SiC epitaxial wafer 11, the impurity concentration of the drift layer 2 which is the SiC epitaxial layer is $1\times10^{14}$/cm³ or more and $5\times10^{15}$/cm³ or less. Therefore, the average of the entire surface of the arithmetic average roughness of the drift layer 2 in the wafer is set to 0.60 nm or more and 3.00 nm or less.

In the manufacturing method of a SiC epitaxial wafer 11 of Embodiment 1, the SiC substrate 1 is placed in a reaction furnace of a CVD apparatus, and the drift layer 2 which is a SiC epitaxial layer having a film thickness of 18 μm or more and 350 μm or less is formed on the SiC substrate 1. The formation conditions of the drift layer 2 are: the pressure in the reaction furnace is 3 kPa or more and 12 kPa or less, the C/Si ratio of material gas supplied to the reaction furnace is 1.0 or more and 1.5 or less, and the growth temperature is 1500° C. or higher and 1750° C. or lower. Accordingly, the number of triangular defects in the drift layer 2 can be significantly reduced, and the device yield is improved.

B. Embodiment 2

In the following, the same components as those described in Embodiment 1 are denoted by the same reference numerals, and the detailed description thereof will be omitted as appropriate.

<B-1. Configuration>

Figure 5:
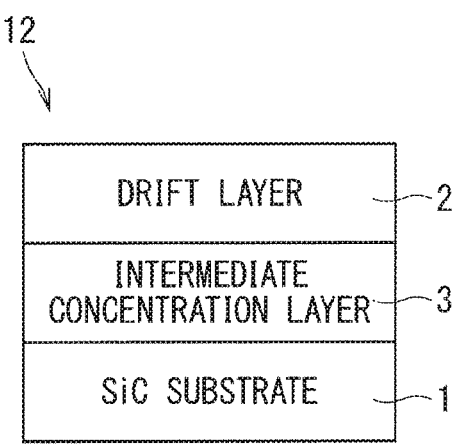
FIG. 5 A cross-sectional view illustrating a configuration of a SiC epitaxial wafer according to Embodiment 2.

FIG. 5 is a cross-sectional view illustrating a configuration of a SiC epitaxial wafer 12 according to Embodiment 2. The SiC epitaxial wafer 12 includes a SiC substrate 1, an intermediate concentration layer 3 formed on the SiC substrate 1, and a drift layer 2 formed on the intermediate concentration layer 3. Although the drift layer 2 is directly formed on the SiC substrate 1 in the SiC epitaxial wafer 11 of Embodiment 1, in the SiC epitaxial wafer 12 of Embodiment 2, the intermediate concentration layer 3 is formed between the SiC substrate 1 and the drift layer 2.

The intermediate concentration layer 3 and the drift layer 2 are the SiC epitaxial layers. The impurity concentration of the intermediate concentration layer 3 is equal to or lower than the impurity concentration of the SiC substrate 1 and equal to or higher than the impurity concentration of the drift layer 2.

The conditions for forming the intermediate concentration layer 3 are as follows. For example, the C/Si ratio of the fed material gases is set to 1.0 or more and 1.5 or less, and the growth temperature is set to 1500° C. or higher and 1700° C. or lower. The nitrogen flow rate is controlled so that the impurity concentration becomes $1\times10^{17}$ [cm$^{-3}$] or more and $2\times10^{19}$ [cm$^{-3}$] or less. The film thickness of the intermediate concentration layer 3 is 0.3 μm or more and 20 μm or less, and the growth rate is 1 μm/h or more.

<B-2. Effect>

The SiC epitaxial wafer 12 of Embodiment 2 includes the intermediate concentration layer 3 interposed between the SiC substrate 1 and the drift layer 2. With this configuration, lattice mismatch stemming from the impurity concentration difference between the SiC substrate 1 and the drift layer 2 can be alleviated, and crystal defects caused by stress from strain in the SiC epitaxial layer caused by the lattice mismatch can be reduced. Thereby, the device yield is improved more than that of the SiC epitaxial wafer 11 of Embodiment 1.

C. Embodiment 3

In the following, the same components as those described in Embodiments 1 and 2 are denoted by the same reference numerals, and the detailed description thereof will be omitted as appropriate.

<C-1. Configuration>

FIG. 6 is a cross-sectional view illustrating a configuration of a SiC epitaxial wafer 13 according to Embodiment 3. The SiC epitaxial wafer 13 includes a SiC substrate 1, an intermediate concentration layer 3 formed on the SiC substrate 1, a concentration gradient layer 4 formed on the concentration layer 3, and a drift layer 2 formed on the concentration gradient layer 4. The SiC epitaxial wafer 13 has a configuration in which a concentration gradient layer 4 is added between the intermediate concentration layer 3 and the drift layer 2 in the SiC epitaxial wafer 12 of Embodiment 2.

In the concentration gradient layer 4, it is set such that the impurity concentration is small on the lower side, i.e., the side close to the intermediate concentration layer 3, and is large at the upper side, i.e., the side close to the drift layer 2, in a manner that the impurity concentration is reduced continuously or stepwise from the intermediate concentration layer 3 to the drift layer 2.

The concentration gradient layer 4, the intermediate concentration layer 3 and the drift layer 2 are the SiC epitaxial layers. The conditions for forming the concentration gradient layer 4 are as follows. For example, the C/Si ratio of the fed material gases is set to 1.0 or more and 1.5 or less, and the growth temperature is set to 1500° C. or higher and 1700° C. or lower. The nitrogen flow rate is controlled such that the impurity concentration of the concentration gradient layer 4 has the above-described concentration distribution.

<C-2. Effect>

The SiC epitaxial wafer 13 of Embodiment 3 includes the concentration gradient layer 4 interposed between the intermediate concentration layer 3 and the drift layer 2. Therefore, crystal defects due to lattice mismatch stemming from the impurity concentration difference between the intermediate concentration layer 3 and the drift layer 2 can be reduced. Thereby, the device yield is improved more than that of the SiC epitaxial wafer 12 of Embodiment 2.

D. Embodiment 4

In the following, the same components as those described in Embodiments 1 to 3 are denoted by the same reference numerals, and the detailed description thereof will be omitted as appropriate.

<D-1. Configuration>

FIG. 7 is a cross-sectional view illustrating a configuration of a SiC epitaxial wafer 14 according to Embodiment 4. The SiC epitaxial wafer 14 includes a SiC epitaxial layer 5. The SiC epitaxial wafer 14 is obtained by removing the SiC substrate 1 from the SiC epitaxial wafer 11 according to Embodiment 1. That is, the SiC epitaxial layer 5 corresponds to the drift layer 2 in the SiC epitaxial wafer 11 of Embodiment 1.

Removing the SiC substrate 1 allows the SiC epitaxial layer 5 to be used, not as the drift layer of Embodiment 1, but as a SiC substrate. At this point, the film thickness of the SiC epitaxial layer 5 is desirably 100 μm or more.

<D-2. Effect>

The manufacturing method of the SiC epitaxial wafer 14 according to Embodiment 4 forms the SiC epitaxial layer 5 having the film thickness of 18 μm or more and 350 μm or less, and removes the SiC substrate 1 after the SiC epitaxial layer 5 is formed. Then, by using the SiC epitaxial layer 5 as the SiC substrate, the SiC epitaxial layer that is remarkably high in quality can be formed on the SiC epitaxial layer 5. Accordingly, device killer defects can be reduced and device yield can be increased.

In Embodiments above, quality of materials, materials, dimensions, shapes, relative arrangement relationship or conditions of implementation of each component may be described in some cases, but the foregoing description is in all aspects illustrative and not restrictive to the description of the present invention. Thus, it is understood that numerous other modifications and variations (including any variations or omissions of optional components, as well as free combinations between different Embodiments) can be devised without departing from the scope of the invention.

EXPLANATION OF REFERENCE SIGNS

1 SiC substrate, 2 drift layer, 3 intermediate concentration layer, 4 concentration gradient layer, 11, 12, 13, 14 SiC epitaxial wafer

The invention claimed is:

1. A SiC epitaxial wafer comprising a SiC epitaxial layer, wherein
   the SiC epitaxial layer has a film thickness of 18 μm or more and 350 μm or less, an arithmetic average roughness of 0.60 nm or more and 3.00 nm or less, and an impurity concentration of $1\times10^{14}/cm^3$ or more and $5\times10^{15}/cm^3$ or less.

2. The SiC epitaxial wafer according to claim 1, wherein an evaluation range of the arithmetic average roughness of the SiC epitaxial layer is an entire surface of the SiC epitaxial layer.

3. The SiC epitaxial wafer according to claim 2, wherein the impurity is nitrogen.

4. The SiC epitaxial wafer according to claim 3, further comprising a SiC substrate formed on a lower surface of the SiC epitaxial layer.

5. The SiC epitaxial wafer according to claim 2, further comprising a SiC substrate formed on a lower surface of the SiC epitaxial layer.

6. The SiC epitaxial wafer according to claim 1, wherein the impurity is nitrogen.

7. The SiC epitaxial wafer according to claim 6, further comprising a SiC substrate formed on a lower surface of the SiC epitaxial layer.

8. The SiC epitaxial wafer according to claim 1, further comprising a SiC substrate formed on a lower surface of the SiC epitaxial layer.

9. The SiC epitaxial wafer according to claim 8, wherein the SiC substrate is formed directly on the lower surface of the SiC epitaxial layer.

10. The SiC epitaxial wafer according to claim 8, further comprising one or more concentration layers between the SiC substrate and the SiC epitaxial layer.

11. A manufacturing method of a SiC epitaxial wafer comprising:
    placing a SiC substrate in a reaction furnace of a CVD apparatus; and
    forming on the SiC substrate a SiC epitaxial layer having a film thickness of 18 pm or more and 350 pm or less, an arithmetic average roughness of 0.60 nm or more and 3.00 nm or less, and an impurity concentration of $1\times10^{14}/cm^3$ or more and $5\times10^{15}/cm^3$ or less, wherein
    formation conditions of the SiC epitaxial layer include: a pressure in the reaction furnace is 3 kPa or more and 12 kPa or less, a C/Si ratio of material gas supplied to the reaction furnace is 1.0 or more and 1.5 or less, and a growth temperature is 1500° C. or higher and 1750° C. or lower.

12. The manufacturing method of the SiC epitaxial wafer according to claim 11, further comprising removing the SiC substrate after said forming the SiC epitaxial layer.

13. The manufacturing method of the SiC epitaxial wafer according to claim 11, wherein
    the SiC substrate is a 4H-SiC n-type substrate doped with nitrogen.

14. The manufacturing method of the SiC epitaxial wafer according to claim 11, further comprising forming one or more concentration layers between the SiC substrate and the SiC epitaxial layer.

* * * * *